US009622384B2

(12) United States Patent
Flet et al.

(10) Patent No.: US 9,622,384 B2
(45) Date of Patent: Apr. 11, 2017

(54) FISHTAIL PACKAGING AND COOLING

(71) Applicant: Quantum Fuel Systems LLC, Lake Forest, CA (US)

(72) Inventors: Fred Flet, Indio, CA (US); Joseph Hudak, Long Beach, CA (US)

(73) Assignee: Quantum Fuel Systems LLC, Lake Forest, CA (US)

( * ) Notice: Subject to any disclaimer, the term of this patent is extended or adjusted under 35 U.S.C. 154(b) by 1173 days.

(21) Appl. No.: 13/664,774

(22) Filed: Oct. 31, 2012

(65) Prior Publication Data

US 2013/0187453 A1 Jul. 25, 2013

Related U.S. Application Data

(60) Provisional application No. 61/562,796, filed on Nov. 22, 2011.

(51) Int. Cl.
*H05K 7/20* (2006.01)
*F28F 3/00* (2006.01)
(Continued)

(52) U.S. Cl.
CPC ............ *H05K 7/20509* (2013.01); *B60L 7/14* (2013.01); *B60L 11/1803* (2013.01);
(Continued)

(58) Field of Classification Search
CPC .... H05K 7/20509; B60L 7/14; B60L 11/1803
(Continued)

(56) References Cited

U.S. PATENT DOCUMENTS 3,823,546 A * 7/1974 Gortz ........................ G04F 5/06
331/116 FE
6,068,513 A * 5/2000 Cameron ............. H01R 25/142
439/620.04
(Continued)

*Primary Examiner* — Rexford Barnie
*Assistant Examiner* — Terrence Willoughby
(74) *Attorney, Agent, or Firm* — Baker & Hostetler LLP

(57) ABSTRACT

A combined battery charger and motor driver circuit assembly includes a plurality of power transistors arranged as a planar array, a cold plate configured to couple heat from each of the transistors in the array, a conductive power coupling fitting (also termed a bus bar), at least one capacitor, and a ferrite bead filter surrounding a necked section of the bus bar. The bus bar has a plurality of individually electrically conductive layers, each two of the layers being separated by an insulating layer, each conductive layer providing a plurality of contacts, the contacts in a layer configured to provide electrical contact, in the alternative, for power transistor collectors or power transistor emitters. The laminated bus bar is extended to form a fishtail shape along a specified section distal to the power transistors. The fish tail section terminates in two electrical contacts configured to provide electrical contact via discrete conductors to respective positive and negative battery terminals. A top surface of the capacitor is conductive at least in part. The capacitor makes electrical and thermal contact with a conductor of the laminated bus bar distal to the transistor array. A bottom surface of the capacitor is also conductive at least in part and is in electrical contact with a conductor of the laminated bus bar proximal to the transistor array.

4 Claims, 8 Drawing Sheets

(51) Int. Cl.
  *H02J 4/00* (2006.01)
  *H02M 7/00* (2006.01)
  *H05K 7/14* (2006.01)
  *B60L 7/14* (2006.01)
  *B60L 11/18* (2006.01)

(52) U.S. Cl.
  CPC ....... *B60L 11/1814* (2013.01); *B60L 11/1816* (2013.01); *B60L 11/1857* (2013.01); *B60L 11/1861* (2013.01); *B60L 11/1874* (2013.01); *F28F 3/00* (2013.01); *H02J 4/00* (2013.01); *H02M 7/003* (2013.01); *H05K 7/1432* (2013.01); *H05K 7/209* (2013.01); *B60L 2200/12* (2013.01); *B60L 2200/18* (2013.01); *B60L 2200/26* (2013.01); *B60L 2200/28* (2013.01); *B60L 2200/36* (2013.01); *B60L 2240/545* (2013.01); *B60L 2240/547* (2013.01); *B60L 2270/147* (2013.01); *Y02T 10/705* (2013.01); *Y02T 10/7005* (2013.01); *Y02T 10/7044* (2013.01); *Y02T 10/7072* (2013.01); *Y02T 90/127* (2013.01); *Y02T 90/14* (2013.01); *Y10T 307/344* (2015.04)

(58) Field of Classification Search
  USPC .............................................. 307/150, 151
  See application file for complete search history.

(56) References Cited

U.S. PATENT DOCUMENTS

2006/0007720 A1* 1/2006 Pfeifer ............... H05K 7/20927
  363/141
2007/0076355 A1* 4/2007 Oohama ............... H01L 25/117
  361/676

* cited by examiner

FISHTAIL PACKAGING AND COOLING

BACKGROUND

1. Field

A thermally connected fishtail shaped bus for transferring power

2. General Background

Most power-using transportation vehicles—specifically, power-propelled surface vehicles, such as automobiles, motorcycles, wheeled and tracked recreational vehicles, buses, trucks, and trains; water-borne vehicles, such as commercial and recreational boats and ships, buoys, manned and unmanned submersibles, etc.; and aerial vehicles, such as airplanes, airships, and balloons—combine a need for storage of potential energy and a need to convert that energy into a readily-used form.

Increasing storage system i.e. battery energy density and reduce mass of components, managing thermal spikes, cooling components which enable necessary actions such as battery charging and providing power for motive force are desiderata.

DISCLOSURE

In accordance with some exemplary implementations, a low-loss heat plate is shown.

In accordance with some exemplary implementations, a method for realizing low losses in a heat plate is shown.

In accordance with some exemplary implementations, a means for transferring energy, in the alternative, between a storage apparatus and a charging apparatus or between a storage apparatus and a load, characterized by low loss, is shown.

In accordance with some exemplary implementations, a low-loss energy conversion apparatus is shown.

There have thus been outlined, rather broadly, certain exemplary implementations of the present disclosure, in order that the detailed description thereof herein may be better understood, and in order that the present contribution to the art may be better appreciated. There are, of course, additional implementations of the disclosure that will be described below and which will form the subject matter of the claims appended hereto.

In this respect, before explaining at least one implementation of the disclosure in detail, it is to be understood that the disclosure is not limited in its application to the details of construction and to the arrangements of the components set forth in the following description or illustrated in the drawings. The disclosure is capable of implementations in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be used as a basis for the designing of other structures, methods, and systems for carrying out the several purposes of the present disclosure. It is important, therefore, that the claims be regarded as including such equivalent constructions insofar as they do not depart from the spirit and scope of the present disclosure.

DRAWINGS

The above-mentioned features of the present disclosure will become more apparent with reference to the following description taken in conjunction with the accompanying drawings, wherein like reference numerals denote like elements. All callouts and text set forth in the figures are hereby incorporated by this reference as if fully set forth herein.

FURTHER DESCRIPTION

Figure 1:
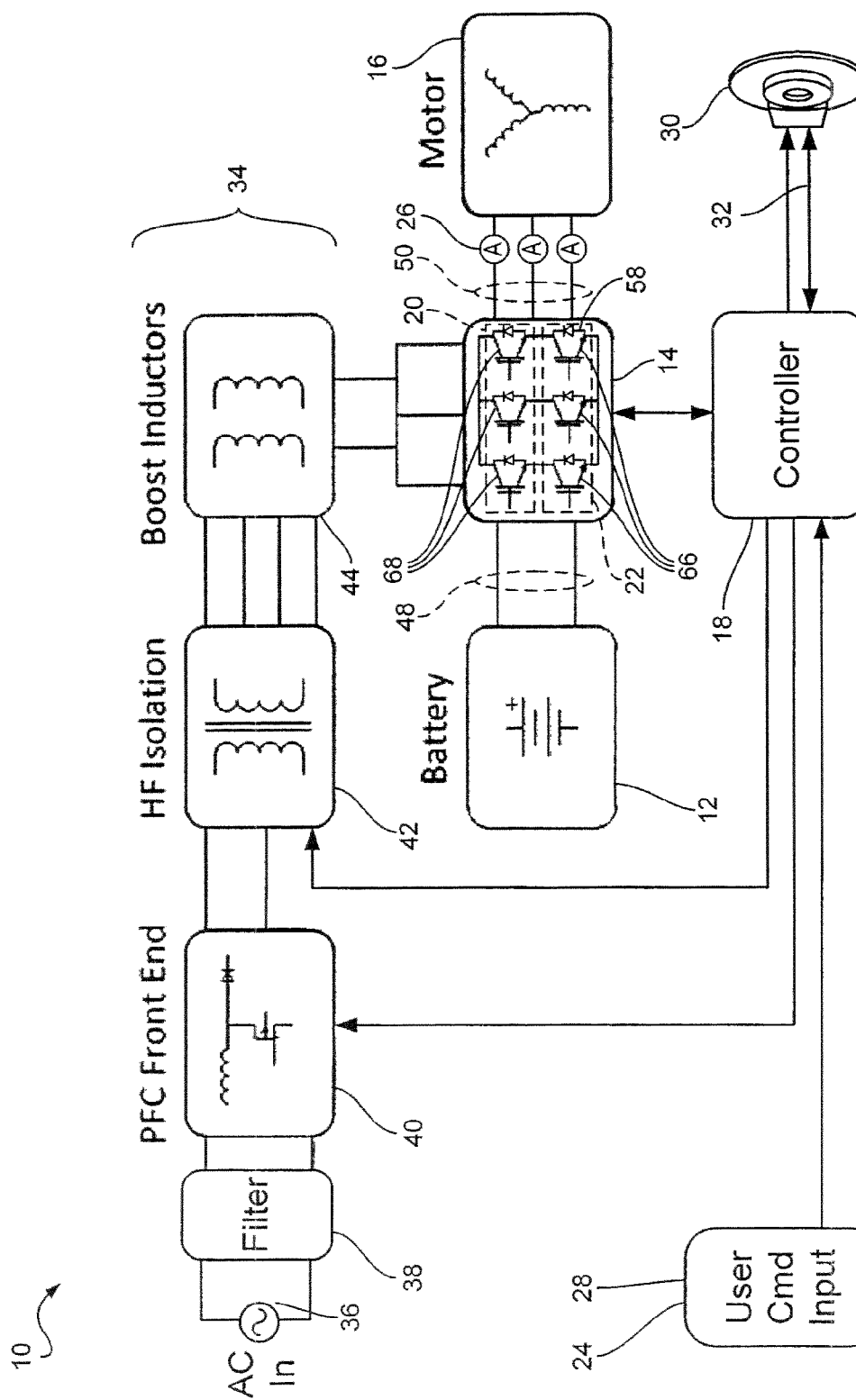
FIG. 1 is a block diagram of a system integrating an electric-powered vehicle and a support subsystem therefor, according to some aspects of an exemplary implementation.

FIG. 1 shows in block diagram 10 arrangement for a pure-electric vehicle which include, but are not limited to motor vehicles having a rechargeable storage battery 12 that is charged by mains power and reversibly discharged through one or more traction motors (which are motors used to provide propulsion) to increase and decrease the kinetic energy of the vehicle (i.e., to accelerate and regeneratively brake the vehicle). The block diagram includes a battery 12 such as an array of cells electrically coupled together in some series-parallel arrangement selected to be effective for satisfying a combined requirement for level and duration of output voltage and current. Traditionally, the connection of secondary (rechargeable) cells or series cell stacks in a parallel configuration tends to cause the voltages of the cells or cell stacks to equalize at a rate that is potentially destructively high for any cells not fully discharged, and that simple forms of connection generally fail to take full advantage of the capacity of the most capable individual cells.

The battery 12 drives an inverter 14, discussed in greater detail below. The inverter 14 output is an n-phase switched waveform directed to an electric motor 16 compatible with the inverter 14 output. The three-phase example in FIG. 1 should not be viewed as limiting. A control unit 18 determines the timing and relative phase of the plurality of output waveforms by turning each of the switches 20, 22 of the inverter 14 on and off at times that realize the instantaneous power commanded through operator command input 24 (analogous to gas pedal or throttle position) and compared to sensed motor current 26 (analogous to torque feedback, manifold vacuum, camshaft and crankshaft position sensor output, and other internal combustion (IC) engine properties). Power waste can be kept low by using digital control, with each switch device 20, 22 on or off, and with power output being varied by pulse width modulation.

Braking can be realized by the control unit 18 accepting a braking command signal from a user braking input 28, a collision avoidance detection device 32, etc. Available vehicle kinetic energy recapture uses the inverter 14 to direct recoverable energy from the motor 16 to the battery 12. Recapture is rate-limited to the overall system's net energy recapture capability. In addition to recapture, braking can be regenerative, with non-recoverable system kinetic energy dissipated as heat in the motor 16, and conventional (mechanical friction) brakes 30, likewise thermal dissipative, can be applied under computer control, via overrides, etc., with or without antilock-braking system (ABS) 32 modulation. Functions of the control unit 18 in the above accelerating and braking modes substantially resemble those performed by similar systems used by other battery-powered traction motor-propelled vehicles.

In order to recharge a battery 12 from a mains supply 36 or from other equivalent sources, a vehicle charging circuit not incorporating an implementation of the present disclosure would require use of a separate form of the overall charging circuit 34, accompanied in most implementations by a mechanical interlock configured to isolate the mains supply source 36, the battery charge path 48, and the battery 12 from the motor drive path 50. It is to be understood that photovoltaic (PV) sourcing, fuel-cell- or combustion-powered sourcing of electricity (i.e., hybrid), and other off-grid technologies may be operationally equivalent to rectification and conditioning of a mains supply 36 for the charging aspect of the implementations disclosed herein. Some off-grid technologies may also sidestep certain aspects of charging from mains supply 36, such as power factor correction. A more extreme form, namely physical exchange of a discharged for a fully charged battery, where used as a sole method for delivering energy to a vehicle, may reduce need for some aspects of the concept disclosed.

Figure 2:
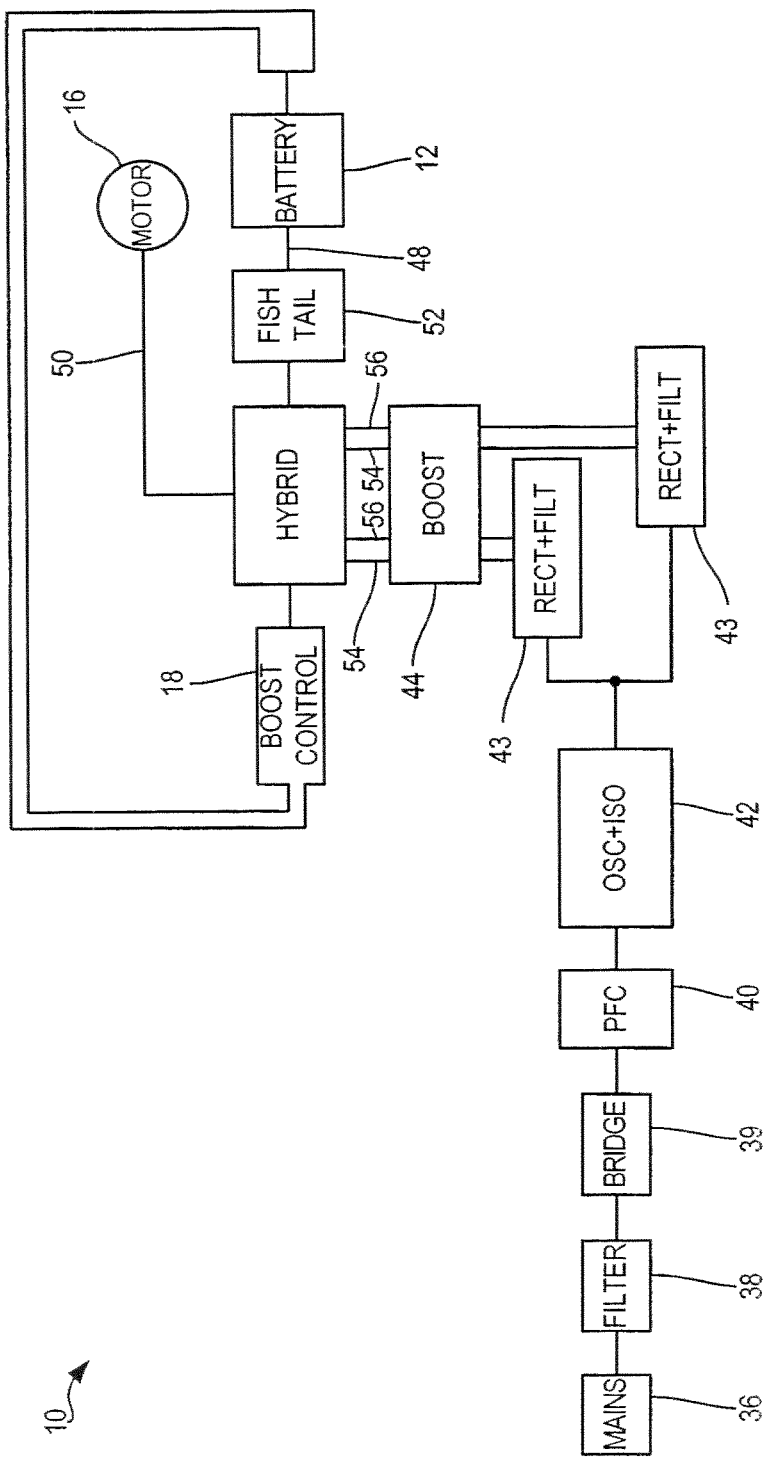
FIG. 2 is an alternative block diagram of the system of FIG. 1.

As shown in FIG. 2, a front-end filter 38 may be included in the charging circuit to provide bidirectional noise suppression, followed by a bridge rectifier assembly 39 and a power factor correction circuit (PFC) 40 of generally conventional design. The latter may be employed as needed to satisfy local power factor regulatory requirements. Typical AC-to-DC converters, such as those used in welders, battery chargers, etc., appear significantly inductive to a mains source 36, and compensation using a PFC 40 can resynchronize voltage and current with the effect of beneficially reducing apparent electrical loading. A typical PFC 40 circuit may use a moderate-frequency chopping circuit (approximately a multiple of mains frequency in the low super-audio range) that manipulates voltage-to-current phase from the highly inductive charger load until the power factor is close to unity.

The transformer (in block 42) has two secondary windings for parallel charging circuits. Timing of the power oscillator in the circuit 42 establishes a single operating frequency that may be optimized for the voltage and load current range required. A controller (not shown in FIG. 2) provides pulse-width modulation control signals to apply current to the transformer primary; the signals collectively provide a combination of voltage and current compatible with the instantaneous requirement for charging the battery 12. This moment-by moment regulated AC waveform is again rectified and filtered 43, providing a DC level compatible with charging the battery 12 from its present state of charge. The boost inductors 44 function as current flywheels in conjunction with the shunt capacitors in the fishtail 52, further discussed below. The exemplary implementation shown has two charger outputs, each of which has the form of a positive node 54 and a negative node 56. In some exemplary implementations, the number of separate transformer secondaries, boost inductors 44, etc., used to drive the battery 12 may be one, three, or another number at user option. In some implementations, controller-based timing of current pulses from respective outputs may be offset from one another (i.e., not simultaneous) to reduce harmonic energy.

The diode-equipped IGBT devices 20, 22 that act as parts of the battery charging function also serve in the motor driving function. In the latter function, all six IGBT devices 20, 22 are active, generally in patterns of three, with each of the three motor windings either momentarily switched to the battery positive or negative terminal or momentarily allowed to float as a succession of pulses from the controller 18 to each IGBT establishes three-phase pulse width modulated excitation of the motor 16.

The above operation is somewhat conventional, although described in such a way as to emphasize exemplary implementations that incorporate the present disclosure. A particular aspect of the charging function in some exemplary implementations is the presence of six IGBT devices 20, 22 (or another multiple of two), all of which are used to drive the motor 16. Each IGBT includes a shunt diode connected from emitter to collector. These freewheeling diodes 58 carry battery charging current during charging from mains power 36.

A representative battery charging waveform, generated from mains power and applied via the IGBT freewheeling diodes 58, may be expected to have appreciable residual switching noise as filtered by typical charger circuitry, such as that discussed above. The noise component of the charging waveform includes switching transients with appreciable energy at multiples of the charger switching frequency—i.e., harmonics—that manifest as voltage and current spikes known to shorten battery life. Such harmonics are preferably suppressed, but passive apparatus for filtering of lower-order harmonics in power circuits, which harmonics may both contain appreciable energy and be more difficult to filter, can be physically large, costly, and wasteful of energy.

Figure 3:
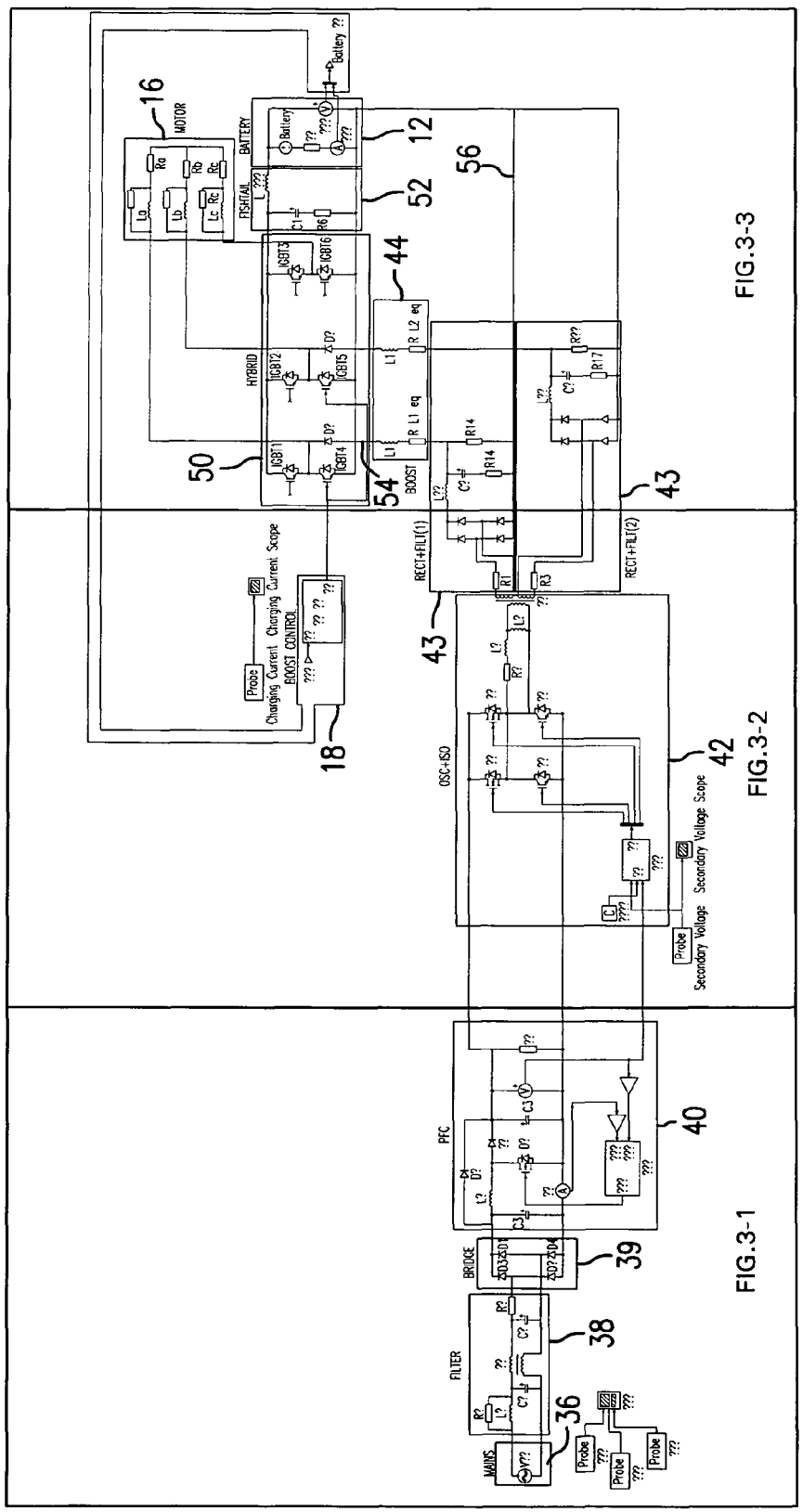
FIG. 3 is an overlay of a schematic diagram on the block diagram of FIG. 2.
Figures 1, 3:
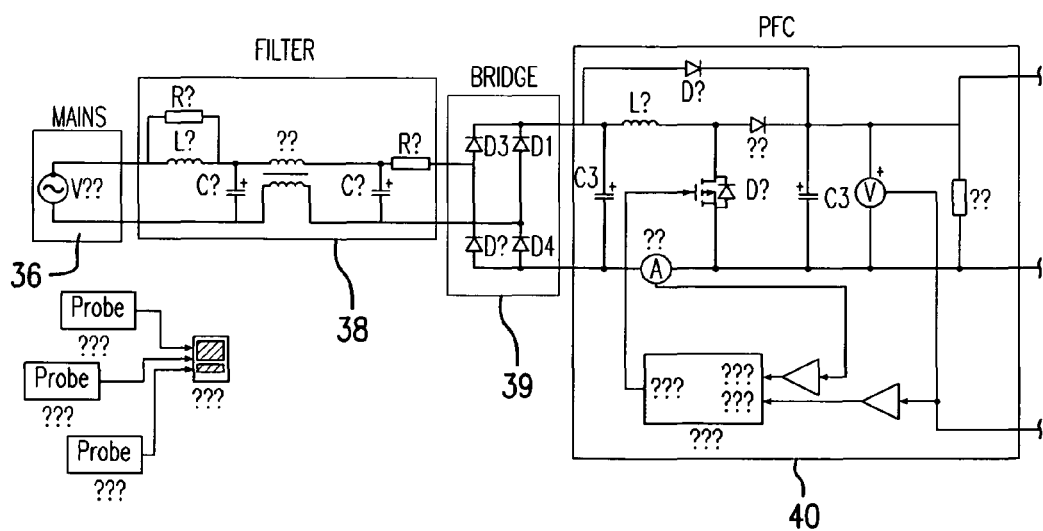
Figures 2, 3:
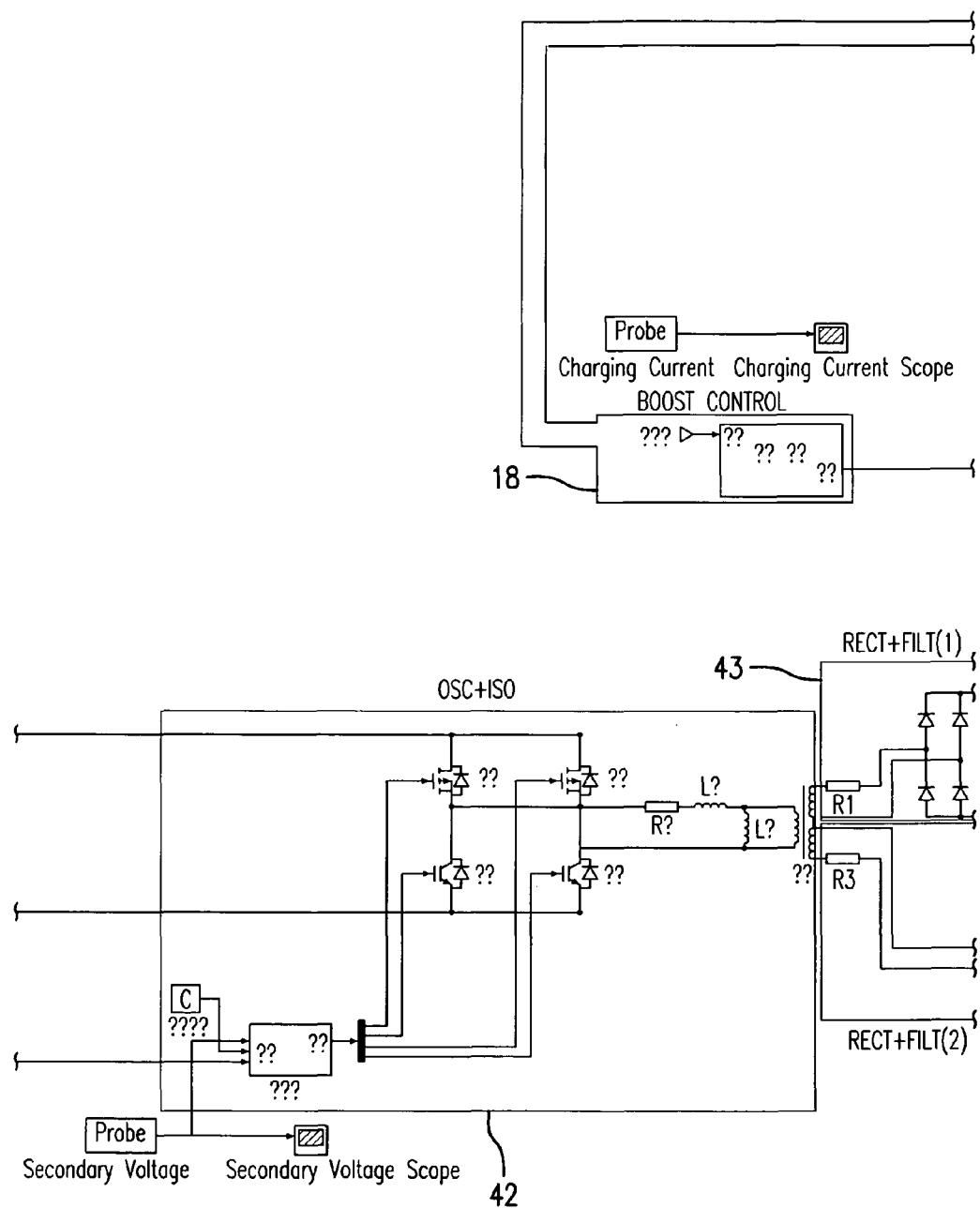
Figure 3:
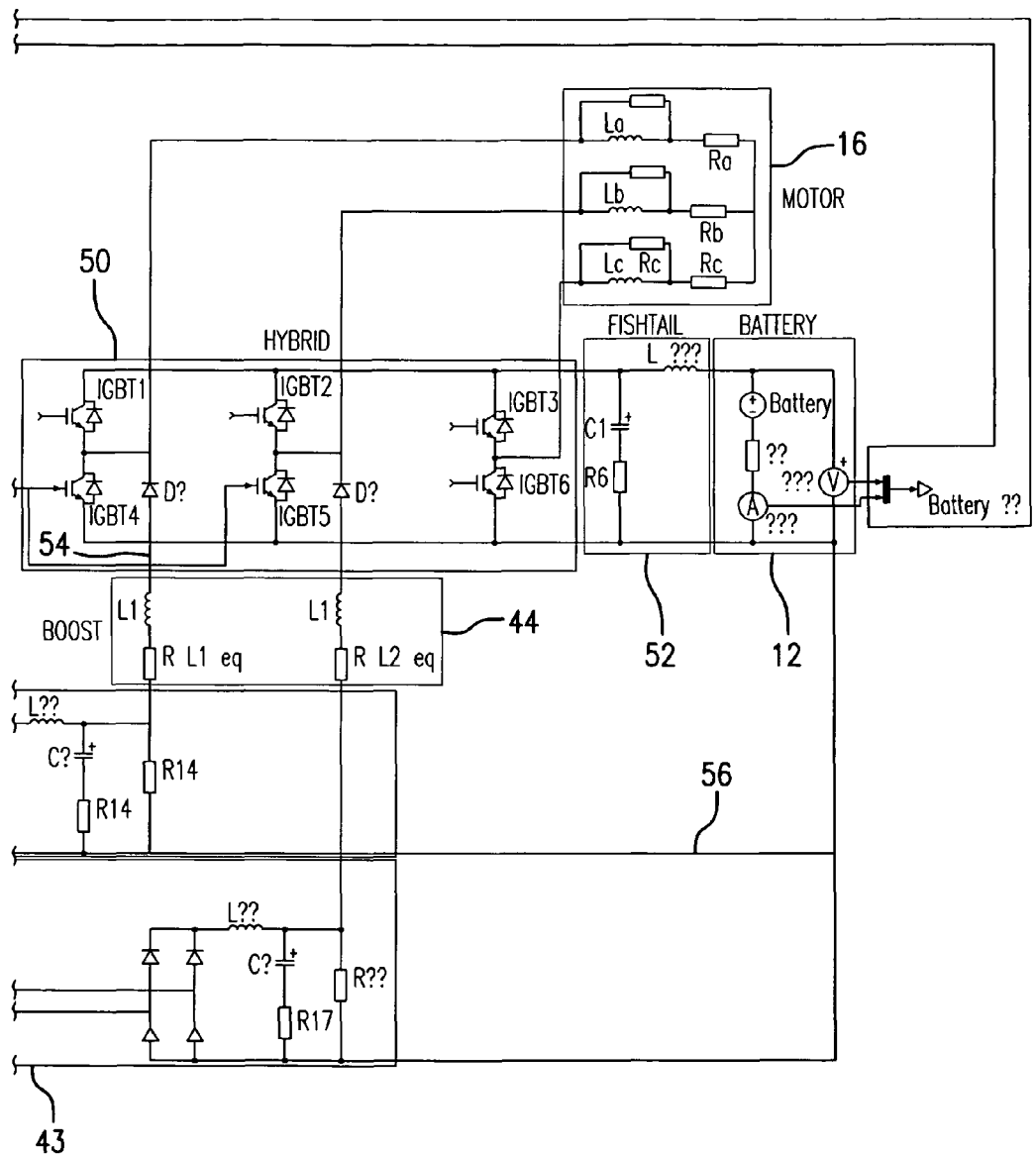

FIG. 3 is an end-to end schematic diagram of an exemplary implementation of the disclosure. FIG. 3 includes the same blocks as FIG. 2, with their internal circuits also shown. involves using two sets of insulated-gate bipolar transistors (IGBTs) 20, 22 to realize a combined motor driver and battery charger circuit, which contrasts with common practice. In some exemplary implementations of the disclosure, during charging of the battery 12, the control unit 18 provides switch mode power supply (SMPS) control signals to the two of the upper IGBTs 20 that are connected from a mains supply 36 via a filter 38 to the isolation circuit 42 windings, and then via the rectifier-filters 43 to the boost inductors 44. The two active IGBTs 20 (identified in FIG. 1; the relative location is the same) provide substantially equal current pulses, which may be alternating, to the battery 12, at a voltage compatible with the battery's allowable rate of charge at its instantaneous state of charge. The circuit has sufficient series inductance and shunt capacitance to keep ripple and switching noise in the charge waveform at a low level, which can extend service life of the battery 12.

Figure 4:
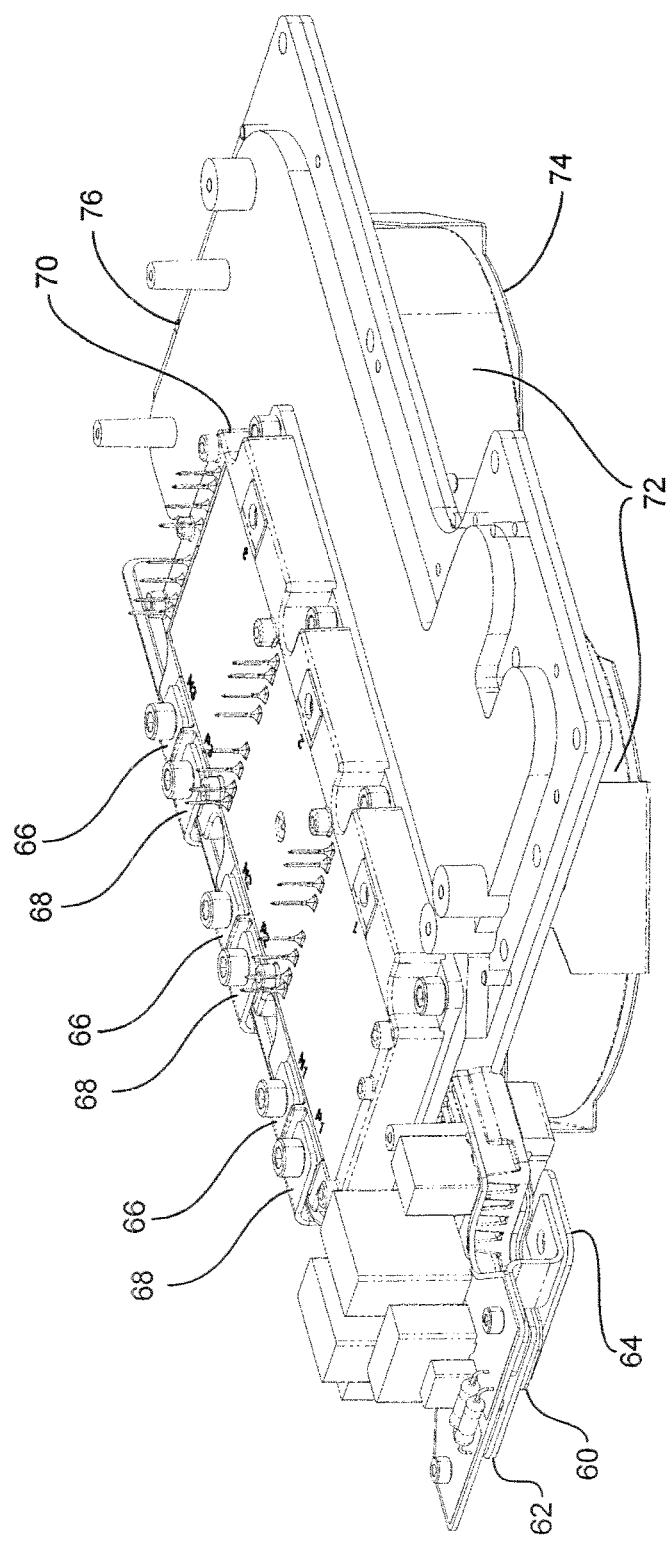
FIG. 4 illustrates a bus bar.

The above-described implementations, arrangement and aspects thereof may be varied or combined depending on a specific use. Having more than one chopper transformer secondary and associated rectifier function provides partial redundancy at low cost. The dual-output configuration also allows the user to establish phase difference between the outputs to increase pulse overlap and improve filtering. These alternative design strategies Charging power is directed from the mains supply 36 via the front-end filter 38, the isolator 42, and the booster inductors 44, all of which, along with the respective IGBTs 20, 22, are shown schematically in FIG. 1. As shown in FIG. 4, a "fish tail" bus bar 60, with a substantially flat top and bottom, carries the reference current from discrete tie points 62 (positive) and 64 (negative) to the connection terminals 66 (emitters) and 68 (collectors) of a unitary six-IGBT hybrid block 70. The IGBT hybrid block 70 may be of a configuration, such as the Infineon® FS800R07A2E3, a device featuring a HybridPACK2™ housing, with which the particular bus bar 60 is designed to mate. The associated capacitors 72, along with their adapter bracket 74 and an associated cold plate 76, complete the structural core of the exemplary implementation. For each equivalent IGBT array that is dimensionally different, bus bar 60 and cold plate 76 configuration may likewise differ to a greater or lesser extent from those shown, but the key features, as discussed below, apply to any six-IGBT array with comparable capability and broadly similar arrangement, as well as to arrangements of single, dual, and triple IGBTs, hybrid or integrated, that may be mounted to a common bus bar 60 of any arrangement and that share a cold plate 76.

The capacitors 72 are of a specific style characterized as having an annular form factor and a high discharge rate, and being of metalized polypropylene film type. The bracket 74 is purpose-developed for providing electrical and thermal contact for two units of one particular size of the indicated type of capacitor. The capacitors 72 fitted between the bus bar 60 and their bracket 74 are selected to exhibit electrical properties that realize significant ripple suppression, and thereby to reduce stress on the battery 12, when compared to previous charging circuit filter configurations.

The selection of a pair of identical, smaller-diameter, lesser-thickness capacitors 72 in place of, for example, one larger-size capacitor having comparable capacitance, equivalent series resistance (ESR), equivalent series inductance (ESL), and voltage withstanding capability, makes the capacitor subassembly more similar in size to the mating subassembly, the IGBT hybrid 70, and the associated cold plate 76. The arrangement further serves to increase and distribute the electrical contact surface area between the respective capacitor 72 electrodes and both the adapter bracket 74 and the affected layer of the bus bar 60, as well as to shorten the effective path length from the capacitors 72 to the bus bar 60. Previous strategies for achieving comparable capacitance have employed larger numbers of physically smaller and conventional annular-lead capacitors (see U.S. Pat. No. 7,046,535, for example), which add resistance as well as reactance in interconnecting conductors, and have appreciably greater ESR and ESL in the capacitors themselves. It is anticipated that other forms and arrangements of battery charging current shunt capacitors 72 and other filtering configurations may achieve ripple suppression performance comparable to that achieved with the arrangement indicated. The exemplary implementation shown in FIGS. 4 and 5 exhibits a combination of high capacitance, high voltage withstand, very low ESR and ESL for selected capacitors, and a very low resistance, low inductance mounting and current transfer bracket that exceeds the performance of previous concepts, including some to which similar capacitors have been applied.

Figure 5:
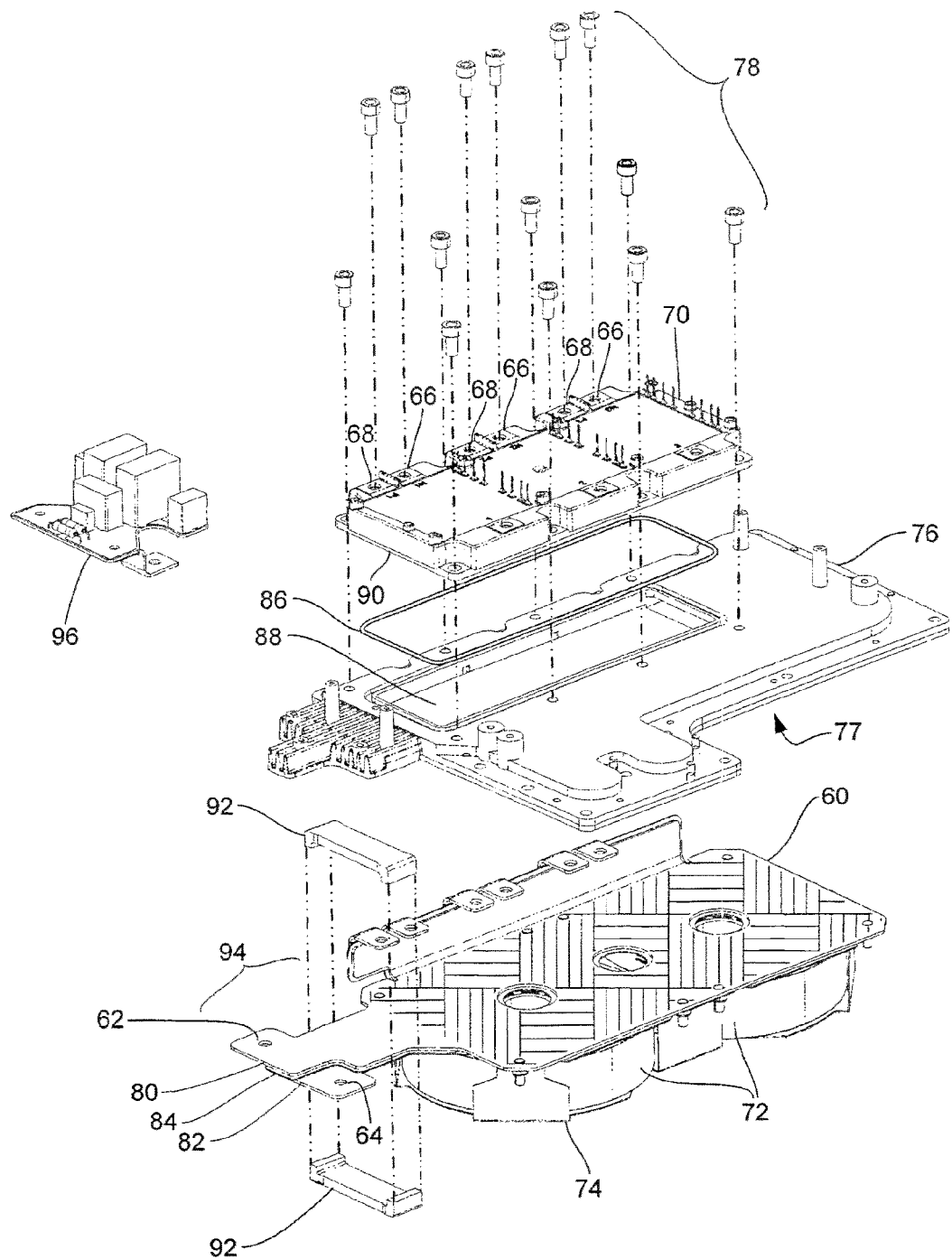
FIG. 5 is a second, exploded perspective view of the subsystem of FIG. 4.

FIG. 5 illustrates in exploded form the exemplary implementation of FIG. 4 namely the bus bar 60, the capacitors 72, the cold plate 76, the capacitor adapter bracket 74, the IGBT hybrid 70, and fastenings 78 to assemble the components.

The inductance of the portion of the link from the IGBT hybrid 70 to the battery 12 allocated to the power switching apparatus itself, as opposed to wiring from the apparatus outputs to the battery 12, is a factor in preventing or allowing charging current waveform overshoot, with greater series inductance being associated with undesirable battery stress. A component design goal for the bus bar 60 on the order of 10 nH-12 nH is practical with exemplary implementations of the present disclosure. This low value of series inductance is not commonly realizable with previous designs. Previous practice might achieve 30 nH, for example, with the relatively high value attributable to use of longer, individual conductors further separated from one another. Implementations of the present disclosure such as those in FIG. 5 have a laminated bus bar 60. For this application the term "bus bar" refers to positive 80 and negative 82 conductors closely and uniformly spaced using flat conductive material of sufficient width and thickness and sufficiently smooth peripheral shape to have both low DC resistance and good suppression of radiated noise. Implementations further have a preferred dielectric material forming a uniform separator 84 between the conductors 80, 82, contributing desirable distributed shunt capacitance while augmenting stiffness at low weight. In some implementations, a selected dielectric material may permit assembly of the bus bar 60 in flat form, followed by bending the bus bar 60 into the shape shown in FIGS. 4 and 5 without appreciable degradation of electrical or mechanical performance.

An additional attribute potentially realized in a laminated bus bar 60 having the necessary configuration is management of common mode (CM) noise, as measured in terms of common mode rejection ratio (CMRR). Previous practice separated positive and negative terminals while forming switch-mode signals at points separated relatively widely in space. The design disclosed herein connects at least some potential sources of common-mode signals by a set of short, parallel paths to the laminated bus bar 60. The short paths truncate, while the close parallel paths reduce the area of, the equivalent of a large loop antenna that might carry charging-mode and operating-mode currents (hundreds of amperes, tens of kilohertz) with appreciable switching transients in other implementations. The indicated configuration significantly decreases emission of CM noise.

At the bus bar current flow through the finite resistance of the IGBT devices of the hybrid dissipates heat as a consequence of operation. Waste heat is preferably dissipated using conductive cooling with a forced-water jacket, termed herein a cold plate 76. The cold plate 76 has an O-ring 86-sealed aperture 88 into which a part of the IGBT hybrid 70 is inserted. This part of the hybrid 70 aligns generally with the pass transistors and freewheeling diodes within. The cold plate 76 has a cooling well shown as a sealable open aperture 88 volume that admits cooling fins (not visible) on the IGBT hybrid bottom plate 90. Those of ordinary skill in the art will recognize that cooling fins are a means to provide surface area for heat exchange and thermal management and that other thermal management structures are within the scope of this disclosure. Flowing water—or any coolant fluid, preferably an antifreeze-and-water blend in many applications—couples the heat from the bottom plate 90 of the hybrid 70 and may be carried to a distal radiator (not shown) for transfer to ambient air, for example. The generally flat, substantially rectangular bus bar 60 contacts the cold plate 76 on the side of the cold plate 76 opposite the hybrid 70, and beyond the bus bar 60 is the capacitor pair 72. By establishing sufficient stiffness and precision of alignment, it is possible to establish relatively efficient thermal coupling between these components, so that their temperatures are relatively uniform, nearly equal, and determined to a significant extent by the temperature of the coolant carried through the cold plate 76.

The width of the bus bar 60, in this implementation as indicated above, is determined in part by the diameter of the two capacitors 72. In order to effectively provide cooling for these devices, the generally flat bottom surface of the cold plate 76 may have about the same surface area and shape as the top surface of the bus bar. In some instance the flat bottom surface of the cold plate may be larger than the top surface of the bus bar and in yet other instance the cold plate bottom surface may extend over the edges of the bus bar. In all case the bottom of the cold plate has a surface area substantially larger than the aperture 88 that receives the IGBT hybrid 70 cooling fins. Accordingly, a higher value of thermal coupling is achieved than is possible with a cold plate 60 that closely conforms to the size of the hybrid 70. Thermal coupling is further enhanced by an electrically insulating and thermally conductive pad 77 (located on the bottom face 90 of the cold plate 60, and contacting approximately the hatched area on the bus bar 60). With the fastenings 78 properly tensioned, the pad 77 can significantly increase heat transfer, lowering the capacitor 72 temperature.

An additional filter subassembly 92 may be added surrounding the fishtail 94. Such a filter 92 includes two half-blocks of a selected "soft" ferrimagnetic material composition that are assembled and clamped together to form a flattened, generally rectangular ring or loop (a "ferrite bead"), and that further attenuate common-mode noise in paired conductors passing within. Because the bus bar 60 layout in the exemplary implementation is defined by flat conductors, a ferrite "bead" configured to clamp around ribbon cable may be applied around the fishtail 94 as shown with scant adaptation. Choice of ferrite material, composition, and exact position on the fishtail may vary depending on the end use, the system parameters and spectral content of noise to be suppressed.

Perched above the two lugs 62, 64 and the associated laminated conductor 94 that jointly make up the "fishtail" of the bus bar 60 is a so-called X/Y capacitor assembly 96. This includes a shunt capacitor from each battery voltage, and thus each bus bar layer, to a ground terminal, plus a shunt capacitor between the bus bar layers proximal to the lugs 62, 64.

The above electrical noise suppression components cooperatively and separately serve to address radiated noise reduction goals with minimal size (weight, volume), while exceeding the established performance standards of the art. Additional electrical noise suppression components can be added, and may further improve electrical quieting.

As of the time of filing of the instant patent application, representative batteries 12 for battery-powered vehicles are used and recharged with long life only if considerable attention is paid to individual cell temperatures, voltages on cells and/or cell stacks, and other dynamic physical properties of the cells as a way to estimate the state of the cells' internal chemistry. In addition to sensing cell temperature and voltage while applying current, the cells, the stacks, or the entire battery 12 may be periodically disconnected from the charge function and briefly connected to a load with current and voltage measured, the results of which can provide more data to tailor the charge rate.

During motor 16 operation, it is assumed that there will not be mains input 36. Since motor operation in vehicular apparatus incorporating some exemplary implementations of the disclosure implies vehicle motion, wired feed is seen as impractical for the categories of devices toward which the disclosure is primarily directed. Obviously, for exemplary implementations serving fixed operation of mains/battery powered equipment, transition from battery to mains input is feasible, and switchover apparatus may be required. Moreover, wireless ("beamed") power distribution is feasible, but implies a technology that may be seen as equivalent to operation from mains power from the point at which interaction with the inventive concept is addressed. For vehicular, mains-recharged applications, it is generally sufficient to provide a mechanical interlock 46 or an electronic sensor-based equivalent that prevents simultaneous application of recharging SMPS signals and battery signals.

While the method and devices have been described in terms of what are presently considered to be the most practical, it is to be understood that the disclosure need not be limited to the disclosed implementations. It is intended to cover various modifications and similar arrangements included within the spirit and scope of the claims, the scope of which should be accorded the broadest interpretation so as to encompass all such modifications and similar structures. The present disclosure also includes any and all implementations of the following claims.

It should also be understood that a variety of changes may be made without departing from the essence of the disclosure. Such changes are also implicitly included in the description. They still fall within the scope of this disclosure. It should be understood that this disclosure is intended to yield a patent covering numerous aspects of the disclosure both independently and as an overall system and in both method and apparatus modes.

Further, each of the various elements of the disclosure and claims may also be achieved in a variety of manners. This disclosure should be understood to encompass each such variation, be it a variation of an implementation of any apparatus implementations, a method or process implementations, or even merely a variation of any element of these.

Particularly, it should be understood that as the disclosure relates to elements of the disclosure, the words for each element may be expressed by equivalent apparatus terms or method terms—even if only the function or result is the same.

Such equivalent, broader, or even more generic terms should be considered to be encompassed in the description of each element or action. Such terms can be substituted where desired to make explicit the implicitly broad coverage to which this disclosure is entitled.

It should be understood that all actions may be expressed as a means for taking that action or as an element which causes that action.

Similarly, each physical element, disclosed, should be understood to encompass a disclosure of the action which that physical element facilitates.

Any patents, publications, or other references, mentioned in this application, for patent, are hereby incorporated by reference. In addition, as to each term used, it should be understood that, unless its utilization in this application is inconsistent with such interpretation, common dictionary definitions should be understood, as incorporated, for each term, and all definitions, alternative terms, and synonyms such as contained in at least one of a standard technical dictionary recognized by artisans and the Random House Webster's Unabridged Dictionary, latest edition, are hereby incorporated by reference.

Finally, all references, listed in the Information Disclosure Statement or other information statement filed with the application, are hereby appended and hereby incorporated by reference; however, as to each of the above, to the extent that such information or statements incorporated by reference might be considered inconsistent with the patenting of this/these disclosure(s), such statements are expressly not to be considered as made by the applicant(s).

In this regard, it should be understood that, for practical reasons, and so as to avoid adding potentially hundreds of claims, the applicant has presented claims with initial dependencies only.

Support should be understood to exist, to the degree required under new matter laws,—including but not limited to United States Patent Law 35 USC 132 or other such laws,—to permit the addition of any of the various dependencies or other elements presented under one independent claim or concept as dependencies or elements under any other independent claim or concept.

To the extent that insubstantial substitutes are made, to the extent that the applicant did not in fact draft any claim so as to literally encompass any particular exemplary implementations, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative exemplary implementations.

Further, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps.

Such terms should be interpreted in their most expansive forms so as to afford the applicant the broadest coverage legally permissible.

The invention claimed is:

1. A device comprising:
   a plurality of power transistors, arranged as a planar array;
   a cold plate, configured to couple heat from each of the transistors in the array;
   a generally flat conductive power coupling fitting, also termed herein a bus bar, having a plurality of individually electrically conductive layers, each two of the layers being separated by an insulating layer, each conductive layer providing a plurality of contacts, the contacts in a layer configured to provide electrical contact, in the alternative, for power transistor collectors or power transistor emitters, said bus bar being necked along a specified section thereof distal to the power transistors, the necked section terminating in two electrical contacts configured to provide electrical contact via discrete conductors to respective positive and negative battery terminals;
   at least one capacitor, whereof a top surface, conductive at least in part, makes electrical and thermal contact with a conductor of said bus bar distal to the transistor array, and a bottom surface, conductive at least in part, makes at least electrical contact with an adapter bracket that makes electrical contact with a conductor of said bus bar proximal to the transistor array; and,
   said bus bar is in physical and thermal contact with said cold plate.

2. The device of claim 1 further comprising a ferrite bead filter surrounding the necked section of the bus bar.

3. The circuit assembly of claim 1, further comprising an X/Y filter subassembly positioned so that two terminals of the X/Y subassembly can be captured between contacts on the discrete conductors and the terminating electrical contacts of the bus bar, where between at least one capacitor is connected, the X/Y subassembly further having at least one additional terminal configured for attachment to an available ground contact provided as a packaging element, and the X/Y subassembly further having at least one capacitor connected from a positive terminal to ground and at least one capacitor connected from a negative terminal to ground.

4. The device of claim 1, wherein at least a portion of the necked section of the bus bar has a tapered width measured along a transverse axis.

* * * * *